(12) United States Patent
Hause et al.

(10) Patent No.: US 6,559,028 B1
(45) Date of Patent: May 6, 2003

(54) METHOD OF TOPOGRAPHY MANAGEMENT IN SEMICONDUCTOR FORMATION

(75) Inventors: Fred N. Hause, Austin, TX (US); Michael B. Allen, Buda, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/051,549

(22) Filed: Jan. 18, 2002

(51) Int. Cl.[7] .............................................. H01L 21/76
(52) U.S. Cl. ...................... 438/424; 438/425; 438/426; 257/510
(58) Field of Search ................................ 438/424–426, 438/692–694, 697, 296, 305–307

(56) References Cited

U.S. PATENT DOCUMENTS 5,930,645 A  *  7/1999  Lyons et al. ................ 438/424
6,403,483 B1 *  6/2002  Hao et al. ................... 438/692

* cited by examiner

*Primary Examiner*—David Nelms
*Assistant Examiner*—D. Le
(74) *Attorney, Agent, or Firm*—Toler, Larson & Abel, LLP

(57) ABSTRACT

The method as disclosed reduces the topological step between the uppermost surface of a substrate and the uppermost surface of a shallow trench isolation feature. The method includes the steps of forming a pad oxide layer overlying a substrate, forming a stop layer overlying the pad oxide layer, forming a second oxide layer overlying the stop layer, forming a patterning layer overlying the second oxide layer, and patterning the patterning layer and underlying stack to form an exposed portion of the substrate. The exposed portion of substrate is etched to form a trench, and the remaining portion of the oxidation resistant layer is removed. Further, a dielectric layer is formed overlying the remaining portion of the second oxide layer, and filling the trench. A portion of the dielectric layer is removed to leave the top of the dielectric layer substantially level with the stop layer, and then the stop layer is removed.

24 Claims, 3 Drawing Sheets

METHOD OF TOPOGRAPHY MANAGEMENT IN SEMICONDUCTOR FORMATION

FIELD OF THE DISCLOSURE

The present invention relates generally to a semiconductor manufacturing process, and more particularly to a method for management of topography in formation of a device having shallow trench isolation features.

BACKGROUND

Isolation of a semiconductor device is generally achieved by utilizing local oxidation of silicon (LOCOS) or shallow trench isolation (STI) techniques. LOCOS is a low cost, uncomplicated manufacturing process, however, the higher packing density requirements of very large scale integration (VLSI) or ultra large scale integration (ULSI) limit the application of LOCOS technology. In STI device isolation techniques, isolation is provided by forming a recess or trench between two active areas, and filling the trench with an isolation material. STI serves to provide higher packing density, improved isolation, and greater planarity by avoiding at least some of the topographical irregularities associated with LOCOS.

When creating the STI structure, it is desirable for the uppermost surface of the substrate to be as coplanar (i.e., flush) as possible with the uppermost surface of the trench fill. This coplanarity maximizes the performance of the finished device, and provides a flat topography for ensuing processing. However, substantial planarity is difficult to achieve in current practices. For example, the use of a thick nitride layer as a combination patterning layer and polish stop results in the undesirable formation of a large step. Such a topographical step makes it difficult to photolithographically process subsequent layers of the device with accuracy, particularly in forming submicron features, thus adversely impacting process yield and production costs. This problem is heightened as circuit geometry is reduced to 0.250 microns and below.

Unfortunately, the thickness of the nitride layer, typically about 1600 to 1800 angstroms, cannot be reduced to the point necessary for it to function effectively as a polish stop (typically between about 300 to 1000 angstroms, depending upon variables in the polishing process) because its thickness is optimized for photolithographic processing. Accurate photolithographic processing requires that the nitride layer on which the mask is formed have a specific optical reflectivity which, in turn, requires the nitride layer to have a thickness greater than that desired for it to function as a polish stop. Furthermore, any change in the thickness of the nitride layer must be made in quantum increments, e.g., 400 angstroms either thicker or thinner at a time, due to the nature of its optical properties. Hence it is difficult to optimize the thickness of the nitride layer as to its polish stop function without adversely impacting subsequent photolithographic processing.

Thus there exists a continuing need for a method of manufacturing a semiconductor device which enables further reduction in the topographical step between the uppermost surface of the substrate or epitaxial layer and the uppermost surface of the trench, without adversely affecting photolithographic processing of the source/drain mask.

DETAILED DESCRIPTION OF THE FIGURES

The method as embodied by the present disclosure is designed to reduce the topological step between the uppermost surface of a substrate and the uppermost surface of a shallow trench isolation feature. In one embodiment, the method includes the steps of forming a pad oxide layer overlying a semiconductor substrate, forming a stop layer overlying the pad oxide layer, forming a second oxide layer overlying the stop layer, forming a patterning layer overlying the second oxide layer, and patterning the patterning layer and underlying stack to form an exposed portion of the semiconductor substrate. The exposed portion of the semiconductor substrate is then etched to form a trench, and the remaining portion of the oxidation resistant layer is removed. Further, a dielectric layer is formed overlying the remaining portion of the second oxide layer of sufficient thickness to fill the trench. A portion of the dielectric layer is removed to leave a top of the dielectric layer substantially level with the stop layer, and then the stop layer is removed. FIGS. 1 through 6 illustrate, in crosssection, process steps in accordance with an embodiment of the present disclosure.

Figure 1:
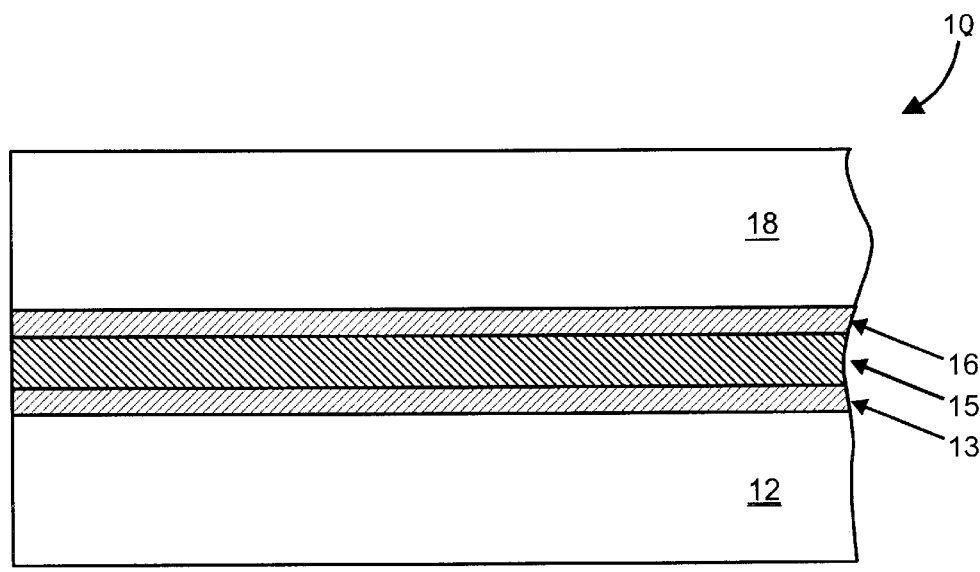
FIGS. 1–6 illustrate, in cross-section, process steps according to at least one embodiment of the present disclosure.

Shown in FIG. 1 is a portion 10 of a device comprising a semiconductor substrate 12, a barrier or pad oxide layer 13, an oxidation resistant "stop" layer 15, a thin thermal oxide layer 16, and a deposited patterning layer 18. Semiconductor substrate 12 is preferably a monocrystalline silicon substrate. Alternatively, semiconductor substrate 12 can also be an epi-crystalline substrate, a silicon on glass substrate, a silicon on sapphire substrate, or the like. An example of first pad oxide layer 13 is an oxide layer which is grown thermally from semiconductor substrate 12 in an oxygen-containing ambient. The thickness of the pad oxide layer 13 ranges from about 50–250 angstroms. Following the formation of pad layer 13, oxidation resistant "stop" layer 15 is formed over pad oxide layer 13. Oxidation resistant stop layer 15 is, in one embodiment, polysilicon having a thickness ranging from about 200 to 600 angstroms. In general, the polysilicon can be deposited by any suitable process such as low pressure chemical vapor deposition (LPCVD), or plasma enhanced chemical vapor deposition (PECVD). Alternatively, oxidation resistant layer 15 can also be another material, such as silicon oxynitride or silicon nitride. In one embodiment, thin thermal oxide layer 16 is formed by thermal oxidation over oxidation resistant layer 15. Thin thermal oxide layer 16 ranges in thickness from about 100 to 200 angstroms. A patterning layer 18 is then deposited over thermal oxide layer 16. Patterning layer 18 may range in thickness from 1000 to 2000 angstroms. In one embodiment, the patterning layer 18 may be a silicon nitride layer which serves as a pattering layer which will be removed in subsequent processing.

Figure 2:
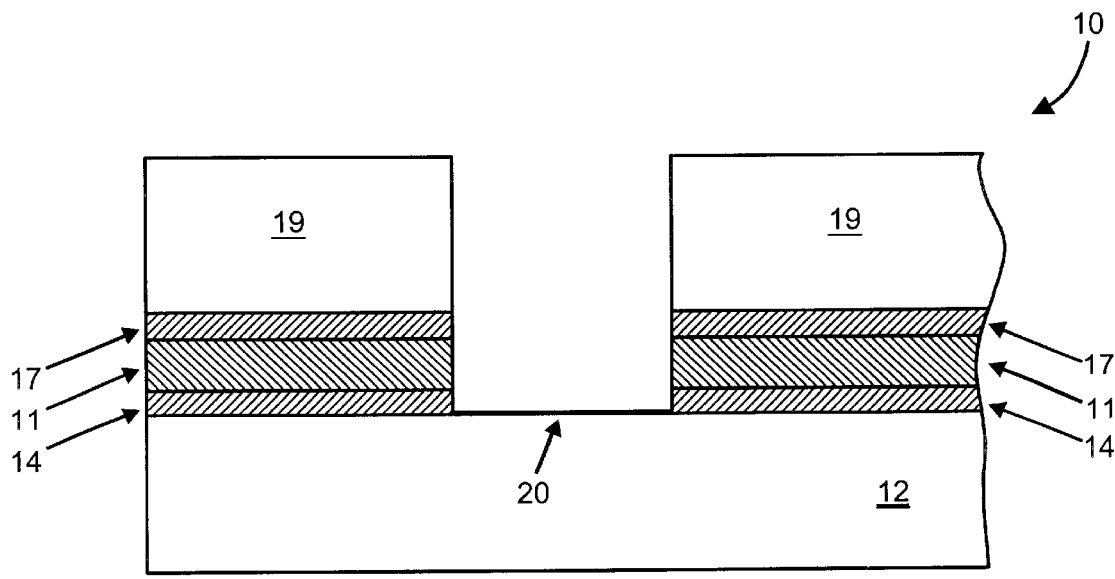

In FIG. 2, photoresist techniques have been employed to pattern patterning layer 18, thermal oxide layer 16, oxidation resistant stop layer 15, and pad oxide layer 13 so that a remaining portion 19 of patterning layer 18 is left overlying a remaining portion 17 of thermal oxide layer 16, a remaining portion 11 of oxidation resistant stop layer 15, a remaining portion 14 of barrier or pad oxide layer 13, and a first portion 20 of semiconductor substrate 12 is exposed. Photoresist masks and standard photolithographic patterning processes may be used to pattern patterning layer 18, thermal oxide layer 16, oxidation resistant stop layer 15, and pad oxide layer 13 (FIG. 1).

Figure 3:
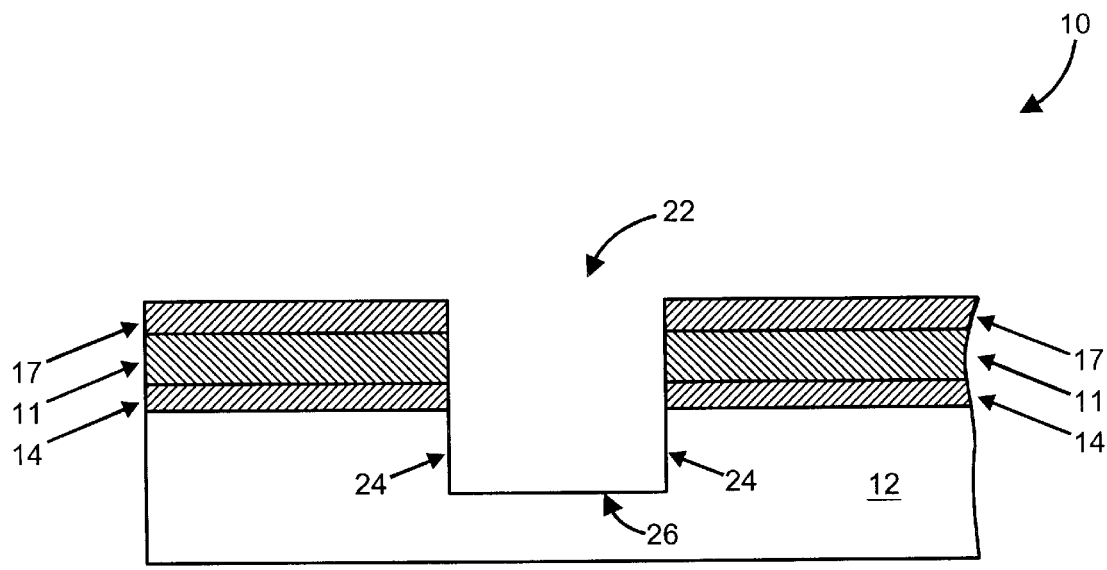

In FIG. 3, first portion 20 of semiconductor substrate 12 is then anisotropically etched using standard etching techniques to form a trench 22 having a trench sidewall 24 and a trench bottom 26. Remaining patterning layer 19 is removed. For example, hot phosphoric acid can be used to remove remaining patterning layer 19 after formation of trench 22. Trench opening 22 preferably has a trench width ranging from about 100 to 10,000 nanometers and a trench depth ranging from about 200 to 5000 nanometers. After formation of trench 22, a cleaning step may be performed on the trench using standard chemistry techniques. While this cleaning step is not required to practice the method as disclosed herein, it serves to remove contaminants which may remain after the etching and stripping steps discussed above.

Figure 4:
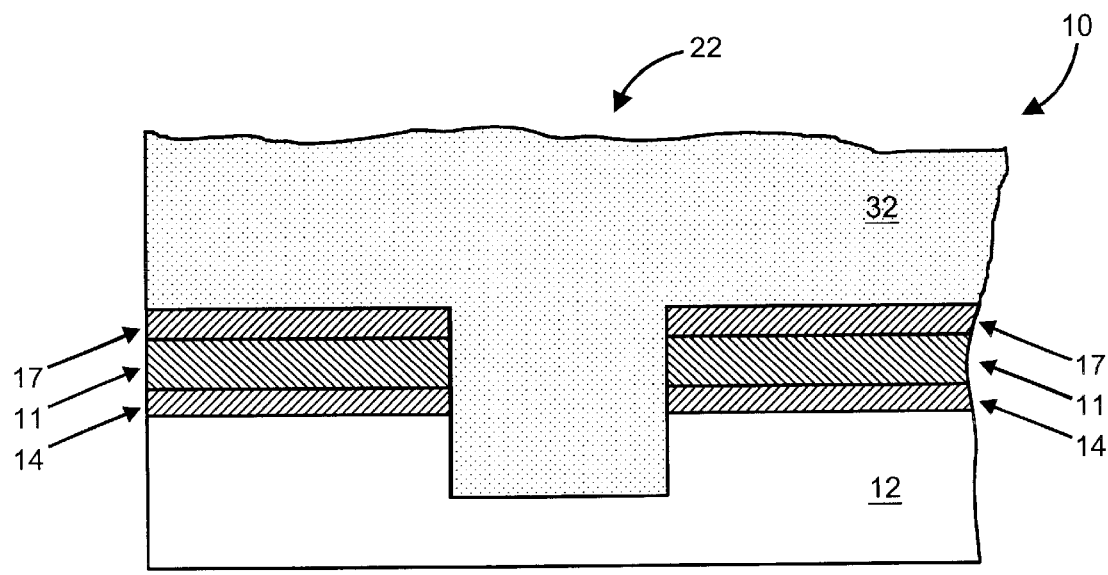

In FIG. 4, trench 22 is filled with a dielectric 32. Dielectric 32 also overlies thermal oxide layer 17, oxidation resistant stop layer 11, and barrier or pad oxide layer 14. In one embodiment, dielectric 32 is tetraethylorthosilicate (TEOS) of sufficient thickness to fill trench 22. Alternatively, dielectric 32 can also be another dielectric material, such as polysilicon, germanium oxide, spin-on-glass, and the like, or a combination of these dielectric materials. Dielectric 32 can be formed using techniques such as chemical vapor deposition, low-pressure chemical vapor deposition, plasma enhanced chemical vapor deposition, electron cyclotron resonance deposition, jet-vapor deposition, spin-on deposition, or other suitable means known to those skilled in the art. In one embodiment, after its formation, dielectric 32 may be annealed in either an inert or an oxidizing ambient in order to densify dielectric 32 to improve the electrical reliability of the final trench isolation structure by minimizing stress and fixed charge along trench sidewalls and trench bottom (not illustrated).

Figure 5:
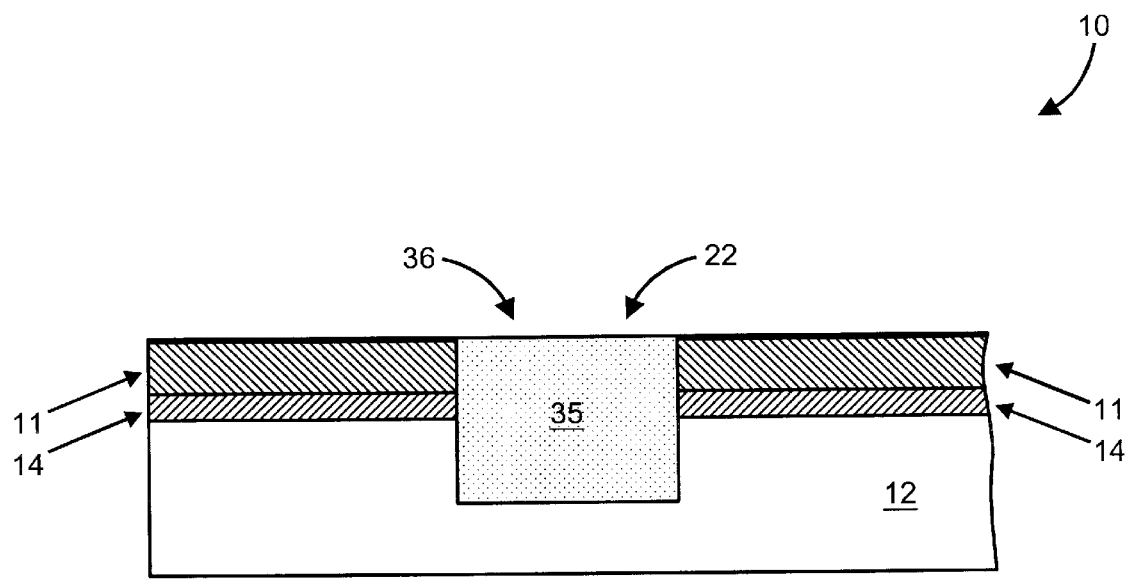

In FIG. 5, a portion of dielectric 32 (FIG. 4) and remaining portion of thin thermal oxide layer 17 (FIG. 4) are then removed to form a trench plug 36 within trench 22. As shown in FIG. 5, trench plug 36 includes a remaining portion 35 of dielectric 32, and substantially fills trench 22. In one embodiment, chemical mechanical polishing (CMP) is used to selectively remove a portion of dielectric 32 and thin thermal oxide layer 17 down to oxidation resistant stop layer 11, to form trench plug 36.

Figure 6:
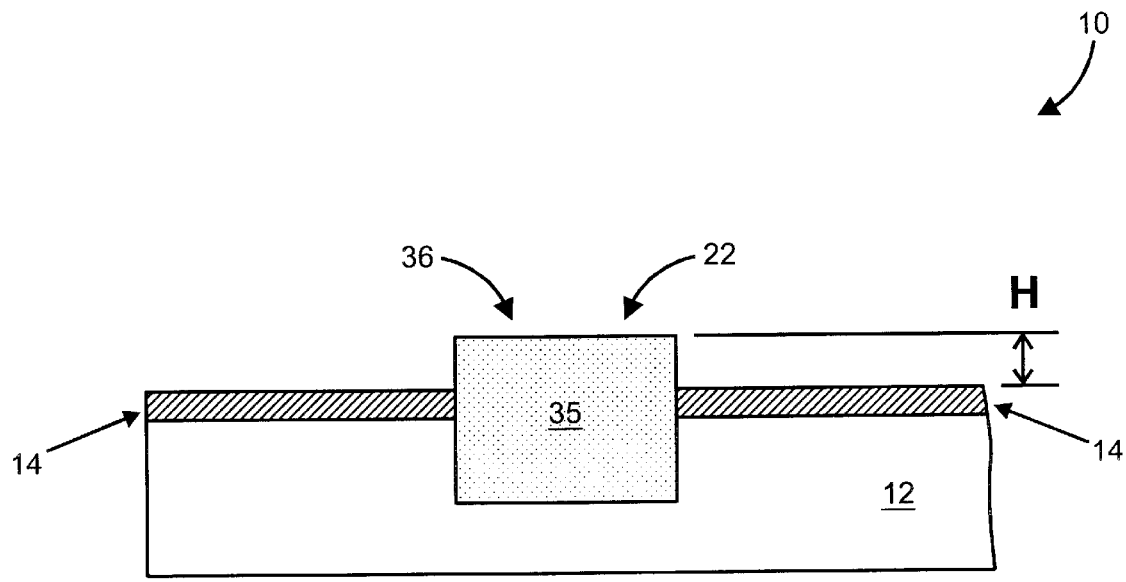

In FIG. 6, oxidation resistant stop layer 11 has been selectively removed to expose barrier or pad oxide layer 14 and trench plug 36. In accordance with an embodiment wherein oxidation resistant stop layer 11 is silicon nitride, remaining portion 11 can be removed in hot phosphoric acid. Alternatively, if oxidation resistant stop layer 11 is polysilicon, removal may be accomplished by using wet or dry etching techniques. In one embodiment, the use of polysilicon as an oxidation resistant stop layer (polish stop) enables the polish stop layer 11 to be thinner than previously utilized nitride polish stop layers, due to the superior polish stop characteristics of polysilicon. Reduction in thickness of the oxidation resistant stop layer decreases topographical steps, and thus enables substantial planarization of the insulating material. Nonplanar surfaces create poor optical resolution in subsequent photolithographic steps. As seen in FIG. 6, the step height H of trench plug 36 remaining after removal of oxidation resistant stop layer 11 corresponds to the thickness of the oxidation resistant stop layer 11, which, in an embodiment, ranges from 200 to 600 angstroms. Hence in an embodiment, the height of step height H ranges from 200 to 600 angstroms. Thus the method as disclosed enables the manufacture of semiconductor devices with a reduction in the height of the topological step between the uppermost surface of a substrate and the uppermost surface of a shallow trench isolation feature.

The foregoing description and illustrations contained herein demonstrate many of the advantages associated with the particular disclosure. In particular, a method is disclosed which is designed to reduce the topological step between the uppermost surface of a substrate and the uppermost surface of a shallow trench isolation feature which should enable substantial planarization of device features, with attendant enhancement of subsequent photolithographic processes. Therefore, with the present disclosure, integrated circuits with high device densities and high reliability may be manufactured.

Thus it is apparent that there has been provided, in accordance with the embodiments as disclosed, a method for reducing the topological step height between the uppermost surface of a substrate and the uppermost surface of a shallow trench isolation feature in an integrated circuit that fully meets the need and advantages set forth previously. Although the disclosure has been described and illustrated with reference to specific embodiments thereof, it is not intended that the disclosure be limited to these illustrative embodiments. Those skilled in the art will recognize that modifications and variations can be made without departing from the spirit of the disclosure. For example, the disclosure is not limited to a specific planarization technique. Furthermore, the disclosure is not limited to a specific material for use as a polish stop layer. Therefore, it is intended that this disclosure encompass all such variations and modifications as fall within the scope of the appended claims.

What is claimed is:

1. A method comprising the steps of:
   forming a pad oxide layer overlying a semiconductor substrate;
   forming a stop layer overlying the pad oxide layer;
   forming a second oxide layer overlying the stop layer;
   forming a patterning layer overlying the stop layer;
   forming a trench in the semiconductor substrate; and
   forming a dielectric layer overlying the semiconductor substrate, the dielectric layer having a thickness sufficient to fill the trench.

2. The method according to claim 1, further including the steps of:
   patterning the patterning layer, the second oxide layer, the stop layer and the pad oxide layer to leave a remaining portion of the patterning layer, a remaining portion of the second oxide layer and a remaining portion of the stop layer overlying a remaining portion of the pad oxide layer, and to form an exposed portion of the semiconductor substrate; and
   etching the exposed portion of the semiconductor substrate to form a trench.

3. The method according to claim 2, further including the steps of:
   removing the remaining portion of the patterning layer;
   removing a portion of the dielectric layer to leave a top of the dielectric layer substantially level with the stop layer; and
   removing the stop layer.

4. The method according to claim 3, wherein the step of removing a portion of the dielectric layer includes using chemical-mechanical polishing.

5. The method according to claim 3, wherein the step of removing the stop layer results in a portion of the dielectric layer protruding above a top of the trench by an amount about the same as a width of the stop layer.

6. The method according to claim 2, wherein the step of etching includes forming a trench width ranging from about 100 to 10,000 nanometers and a trench depth ranging from about 200 to 5000 nanometers.

7. The method according to claim 2, wherein the step of forming the second oxide layer includes forming the second oxide layer to have a thickness of from about 100 to 200 angstroms.

8. The method according to claim 1, wherein the step of forming the pad oxide layer includes forming a thermal oxide layer to have a thickness of from about 50 to 250 angstroms.

9. The method according to claim 1, wherein the step of forming the stop layer includes forming the stop layer of one of: polysilicon, silicon oxynitride or silicon nitride.

10. The method according to claim 1, wherein the step of forming the stop layer includes forming the stop layer to have a thickness of about 200 to 600 angstroms.

11. The method according to claim 1, wherein the step of forming the patterning layer includes forming a patterning layer having a thickness of about 1000 to 2000 angstroms.

12. The method according to claim 1, wherein the step of forming the pattering layer includes forming the patterning layer of silicon nitride.

13. The method according to claim 1, wherein the step of forming the dielectric layer includes forming a layer of tetraethyl orthosilicate.

14. A method comprising:

forming a pad oxide layer overlying a semiconductor substrate;

forming a polish stop layer overlying the pad oxide layer;

forming a thermal oxide layer overlying the stop layer;

forming a nitride layer overlying the thermal oxide layer;

patterning the nitride layer, the thermal oxide layer, the polish stop layer and the pad oxide layer to leave a remaining portion of the nitride layer, a remaining portion of the thermal oxide layer and a remaining portion of the polish stop layer overlying a remaining portion of the pad oxide layer, and to form an exposed portion of the semiconductor substrate;

etching the exposed portion of the semiconductor substrate to form a trench;

removing the remaining portion of the nitride layer;

forming a dielectric layer overlying the remaining portion of the second oxide layer and the trench, the dielectric layer having a thickness sufficient to fill the trench;

polishing the dielectric layer to leave a top of the dielectric layer substantially level with the polish stop layer; and removing the polish stop layer.

15. The method according to claim 14, wherein the step of forming the pad oxide layer includes forming a thermal oxide layer to have a thickness of from about 50 to 250 angstroms.

16. The method according to claim 14, wherein the step of forming the polish stop layer includes forming the stop layer of one of: polysilicon, silicon oxynitride or silicon nitride.

17. The method according to claim 14, wherein the step of forming the polish stop layer includes forming the stop layer to have a thickness of from about 200 to 600 angstroms.

18. The method according to claim 14, wherein the step of forming the thermal oxide layer includes forming the thermal oxide layer to have a thickness of from about 100 to 200 angstroms.

19. The method according to claim 14, wherein the step of forming the nitride layer includes forming a nitride layer having a thickness of from about 1000 to 2000 angstroms.

20. The method according to claim 14, wherein the step of forming the nitride layer includes forming the nitride layer of silicon nitride.

21. The method according to claim 14, wherein the step of forming a dielectric layer includes forming a layer of tetraethyl orthosilicate.

22. The method according to claim 14, wherein the step of removing a portion of the dielectric layer includes using chemical-mechanical polishing.

23. The method according to claim 14, wherein the step of etching includes forming a trench width ranging from about 100 to 10,000 nanometers and a trench depth ranging from about 200 to 5000 nanometers.

24. The method according to claim 14, wherein the step of removing the polish stop layer results in a portion of the dielectric layer protruding above a top of the trench by an amount about the same as a width of the stop layer.

* * * * *